United States Patent [19]

Apel

[11] 4,442,407
[45] Apr. 10, 1984

[54] TWO LOOP AUTOMATIC LEVEL CONTROL FOR POWER AMPLIFIER

[75] Inventor: Thomas R. Apel, Cedar Rapids, Iowa

[73] Assignee: The United States of America as represented by the Secretary of the Army, Washington, D.C.

[21] Appl. No.: 387,307

[22] Filed: Jun. 11, 1982

[51] Int. Cl.³ .......................... H03G 3/20; H03C 1/00
[52] U.S. Cl. .................................. 330/128; 330/129; 330/202; 330/297; 332/59; 455/127
[58] Field of Search ............... 330/127, 128, 129, 202, 330/297; 332/59; 455/116, 126, 127

[56] References Cited

U.S. PATENT DOCUMENTS

| | | | |
|---|---|---|---|
| 3,413,570 | 11/1978 | Bruene et al. | 332/9 |
| 3,486,128 | 12/1969 | Lohrmann | 455/126 |
| 4,320,350 | 3/1982 | Drapac | 330/202 |

Primary Examiner—James B. Mullins
Attorney, Agent, or Firm—Robert P. Gibson; Sheldon Kanars; Jeremiah G. Murray

[57] ABSTRACT

The power supply potential applied to the final stage of an RF amplifier is modulated by means of an adaptive power supply. The power supply potential applied to the final RF amplifier is controlled by a first control loop in accordance with an error signal derived from a comparison of a signal corresponding to the weighted sum of the magnitude of the supply voltage applied and the current drawn by the final amplifier and the amplitude of the modulating signal. Additionally, an automatic level control circuit controls the level of the RF output signal in a second control loop in accordance with a comparison between the magnitude of the RF output of the amplifier and the amplitude of the modulating signal.

13 Claims, 3 Drawing Figures

TWO LOOP AUTOMATIC LEVEL CONTROL FOR POWER AMPLIFIER

The Government has rights in this invention pursuant to Contract No. DAAB07-78-C-0160.

BACKGROUND OF THE INVENTION

This invention relates to power amplifiers for electrical signals and more particularly to a signal modulated power amplifier having high efficiency of operation over a wide range of operating conditions.

RF amplifiers whose DC potential voltages are continuously varied to match signal level requirements for maintaining high efficiency operation throughout a predetermined range of input signal levels are generally known. One such example is disclosed in U.S. Pat. No. 3,413,570 entitled, "High Efficiency RF Power Amplification With Modulation Signal Controlled On-Off Switch Varied Amplifier DC Potentials", issued to W. B. Bruene, et al. on Nov. 26, 1968. There both non-linear and linear amplifiers are operated at a relatively high efficiency by modulation of the RF amplifier DC supply potentials which are caused to vary continuously in accordance with the amplitude of the modulating input signal.

Another such example is disclosed in U.S. Pat. No. 4,320,350 entitled, "Sliding Power Supply For RF Power Amplifier", by Michael J. Drapac. In that invention the power supplied by a sliding power supply to a power amplifier is indirectly controlled by a single feedback loop which operates in accordance with the load impedance voltage standing wave ratio of the amplifier.

Accordingly, it is an object of the present invention to provide improved control of an RF amplifier for maintaining power amplifier efficiency at a relatively high level.

It is another object of the present invention to provide an improvement in power supply and signal modulation of an RF amplifier for providing improvement in efficiency over a wide range of load, line voltage and envelope power.

Still a further object of the present invention is to provide a two loop feedback control of an RF amplifier for providing an improvement in amplifier efficiency.

SUMMARY OF THE INVENTION

The foregoing as well as other objects are achieved by a two loop combination of an adaptive power supply feedback control loop for an RF power amplifier where the power supply control is effected through an error signal obtained from a comparison of a signal corresponding to the weighted sum of the magnitudes of the amplifier's supply voltage and current driven by the amplifier and the amplitude of the modulating signal, and an automatic level feedback control loop which amplitude modulates the power amplifier in accordance with a comparison between the amplitude of the modulating signal and the level of the RF output signal.

DESCRIPTION OF THE PREFERRED EMBODIMENT

Figure 1:
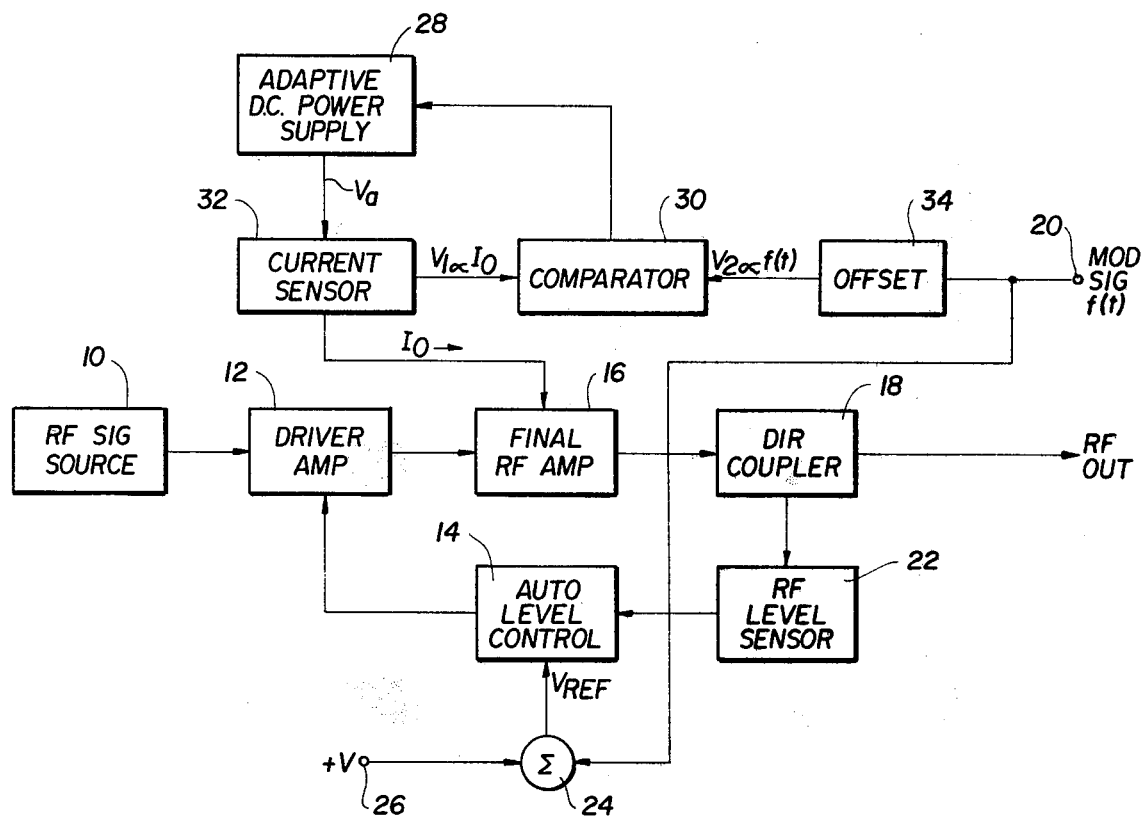
FIG. 1 is an electrical block diagram illustrative of the preferred embodiment of the invention.

Referring now to the drawings wherein like reference numerals refer to like components, attention is first directed to FIG. 1. There reference numeral 10 designates an RF signal source which is to be modulated. The output from the RF signal source 10, which may be either of the pulse or CW type, is coupled to a driver amplifier 12 where it is amplitude modulated by means of an automatic level control circuit 14. The amplitude modulated RF signal is coupled to a final RF amplifier stage 16 where it is coupled as an RF output to suitable antenna means, not shown, via a directional coupler 18.

The automatic level control circuit 14 is incorporated in a feedback control loop which is responsive to a feedback signal derived from the RF output signal level and the modulating signal f(t). In FIG. 1 the modulating signal f(t) is shown applied to terminal 20 while the RF signal level is detected by an RF signal level sensor 22 coupled to the directional coupler 18. The modulating signal is applied to a summing junction 24 where there is also applied a DC bias potential +V coupled to terminal 26. The modulation signal with the DC bias applied is coupled as a composite reference signal $V_{ref}$ to the automatic level control circuit 14 along with the output of the RF level sensor 22. The control circuit 14 operates to generate an error signal in a well known manner, such as by differencing the two inputs to the automatic level control circuit 14, which then operates to vary the gain, for example, of the driver amplifier 12 to amplitude modulate the RF signal applied from the source 10.

The subject invention more importantly includes another feedback control loop involving the modulation signal f(t) applied to terminal 20 and an adaptive DC power supply 26 which outputs a variable supply potential $V_a$ to the final stage 16 of the RF amplifier in accordance with an error signal derived from the comparison between a signal corresponding to the weighted sum of the magnitude of the final amplifier load current $I_O$ and supply voltage $V_a$ and the amplitude of the modulating signal f(t). The error signal for controlling the adaptive power supply 26 is generated by means of a comparator circuit 30 which is coupled to a current sensor 32 and a signal corresponding to the magnitude of the modulating signal. As shown in FIG. 1, the modulating signal is applied to the comparator 30 by means of an offset circuit 34 which is adapted to apply a DC bias to the modulating signal by a predetermined amount in the same fashion that the summing junction 24 applies a DC bias to the modulating signal for developing the reference voltage $V_{ref}$ for the automatic level control circuit 14.

Figure 2:
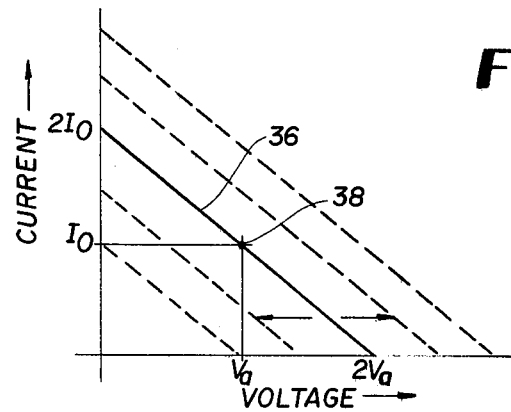
FIG. 2 is a graph illustrative of the operational characteristic of the embodiment shown in FIG. 2.

In operation, the control loop involving the automatic level control circuit 14 and the control loop involving the adaptive power supply 28 maintains amplifier efficiency at a high level over a wide range of operating conditions such as load, primary line voltage and envelope power. This is achieved primarily by the adaptive power supply control loop of FIG. 1, which causes the load line of the power supply 28 to follow the modulating signal f(t) as shown by the current vs. voltage diagram of FIG. 2. There reference numeral 36 denotes the power supply load line which has zero voltage and current intercepts of $2V_a$ and $2I_0$, respectively. With no modulating signal applied, an operating point 38, for example, for an output voltage $V_a$ causes a current $I_0$ to be drawn by the final RF amplifier 16. The effect of the modulating signal f(t), however, causes the error control signal output from the comparator 30 to shift the load line 36 laterally in either direction from the position shown in FIG. 2. It is this lateral shift which comprises the major improvement over prior art power amplifiers which include variable power supplies for providing an enhancement for improvement in the efficiency of the amplifier. The combined effect of the two control loops, however, form an even greater enhancement of control of the overall amplifier efficiency.

While the embodiment shown in FIG. 1 is adapted for an amplitude modulated power amplifier, it is within the scope of one skilled in the art, when desirable, to also utilize FM modulation techniques. Also while a current sensor 32 is shown, the adaptive power supply control loop could be implemented utilizing a voltage sensor. Additionally, the adaptive power supply 28 may be configured of a switching type supply shown and described, for example, by the aforementioned Bruene, et al. patent.

Figure 3:
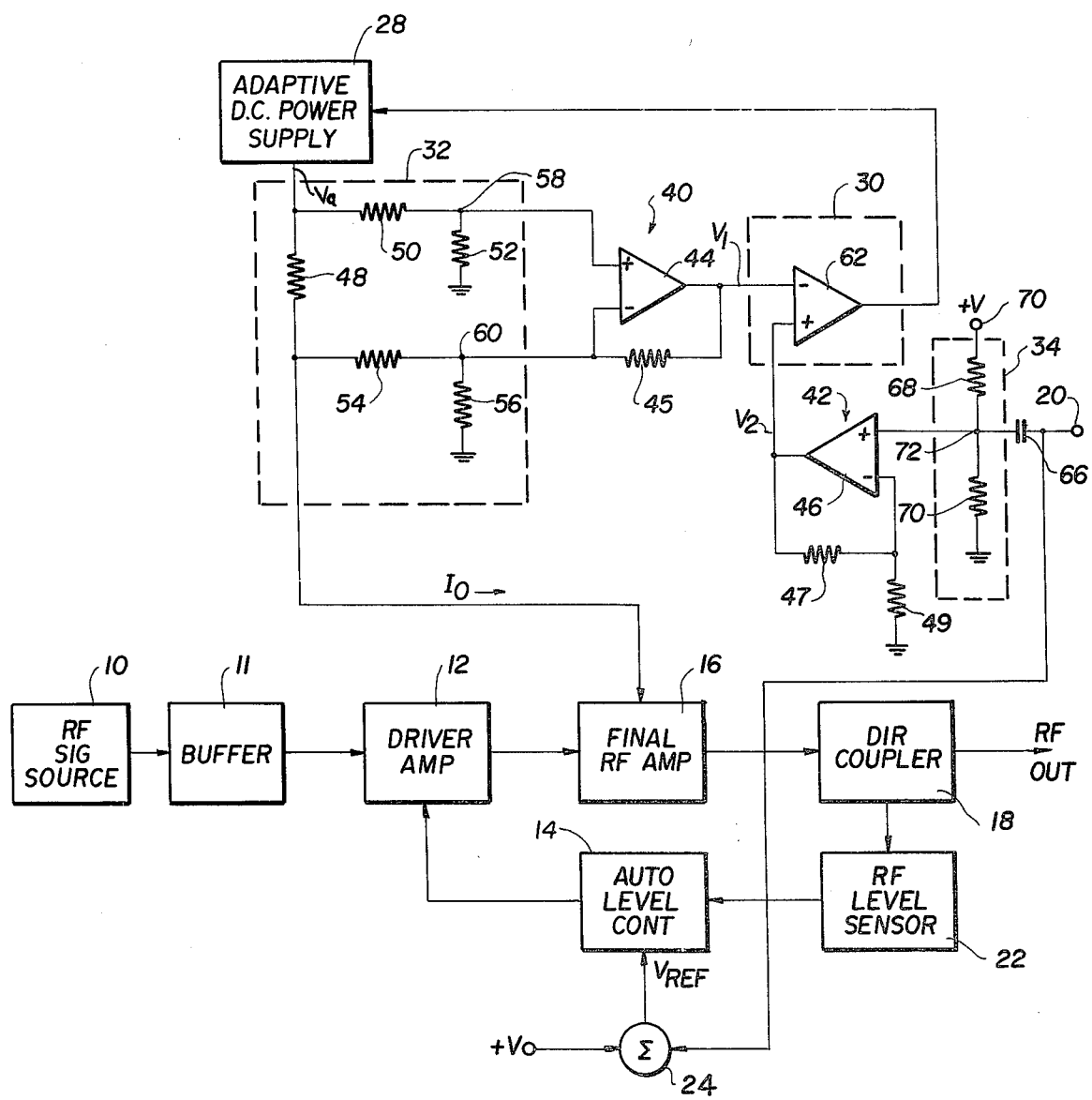
FIG. 3 is a partial electrical schematic and block diagram further illustrative of the embodiment shown in FIG. 1.

Referring now to FIG. 3, shown therein are the specific circuit details of the adaptive power supply control loop of FIG. 1. As shown in FIG. 3, circuitry for the current sensor 32, the comparator 30 and the offset circuit 34 are disclosed together with the addition of a pair of gain setting summing amplifiers 40 and 42 consisting of operational amplifiers 44 and 46. With respect to the current sensor 32, it is comprised of a series resistor 48 connected between the adaptive power supply circuit 28 and the final RF amplifier stage 16 and across which are coupled two resistive voltage dividers consisting of resistors 50, 52 and 54, 56. The common connection or intermediate circuit node 58 between resistors 50 and 52 is connected to the plus (+) input of the operational amplifier 40 while the common connection 60 between resistors 54 and 56 is connected to the negative (−) input of the amplifier 40. A gain setting feedback resistor 45 is also connected from the output to the negative input. Accordingly, the amplitude of the current $I_0$ is measured in terms of the voltage drop across the resistor 48. The comparator circuit 30 is shown in FIG. 3 comprised of a differencing operational amplifier 62 having its negative (−) input connected to the output of the gain setting summing amplifier 40 which along with the circuitry 32 develops an output signal $V_1$ proportional to the weighted sum of the supply voltage $V_a$ and the load current $I_0$. The plus (+) input to the differencing amplifier 62 is connected to the output of the gain setting amplifier 42 which includes a gain setting feedback resistor 47 and a resistor 49 referencing the negative (−) input to ground. The output of operational amplifier 46 comprises an amplified voltage $V_2$ proportional to the modulating signal f(t) which is applied to terminal 20 and connected to the offset circuit 34 by means of a coupling capacitor 66. A DC bias or offset is provided by a resistive voltage divider consisting of a pair of resistors 68 and 70 connected in series between a DC voltage terminal 70 to which is applied a power supply potential +V and ground. The offset voltage applied to the modulating signal is the magnitude of the DC voltage appearing at circuit junction or intermediate circuit node 72. Accordingly, the modulating signal f(t) offset by the DC voltage appearing at circuit junction 72 is applied to the plus (+) input of the gain setting amplifier 42.

Thus what has been shown and described is the combination of two control loops which provide an improved power level of control having a relatively high efficiency.

While the present invention has been shown with a certain degree of particularity, it should be noted that the foregoing detailed description has been made by way of illustration and not of limitation and accordingly, all alterations, changes and modifications coming within the spirit and scope of the invention as defined in the appended claims are herein meant to be included.

What is claimed is:

1. Control circuit means for maintaining high efficiency in a modulated RF power amplifier having a modulating signal applied thereto and powered by an adaptive power supply, comprising:
   at least one control loop including,
   means providing a power supply potential to at least one amplifier stage of said power amplifier from said adaptive power supply,
   sensor means for sensing an operational parameter of said at least one amplifier stage and providing a signal in accordance therewith,
   means providing a signal corresponding to the weighted sum of the magnitude of said power supply potential and said operational parameter signal,
   means for providing a comparison between the weighted sum signal and the magnitude of said modulating signal generating a control signal therefrom, and
   means coupling said control signal to said adaptive power supply which operates to vary said power supply potential in accordance with said control signal.

2. The control circuit means as defined by claim 1 wherein said operational parameter comprises the load current supplied to said at least one amplifier stage.

3. The control circuit means as defined by claim 2 and additionally including means for providing a DC offset to the amplitude of said modulating signal applied to said comparing means.

4. Control circuit means for maintaining high efficiency in a modulated RF power amplifier having a modulating signal applied thereto and powered by an adaptive power supply, comprising in combination:
   a first control loop including,
   means for providing a power supply potential to at least one amplifier stage of said RF power amplifier from said adaptive power supply,
   sensor means for sensing the current supplied to said at least one amplifier stage and provding a signal corresponding to the amplitude thereof,
   means providing a signal corresponding to the weighted sum of the magnitudes of said power supply potential and current supplied,
   means for comparing the amplitude of said weighted sum signal and the amplitude of said modulating signal and generating a power supply control signal therefrom, and
   means coupling said control signal to said adaptive power supply which operates to vary said power supply potential in accordance with said control signal, and
   a second control loop including,
   means for controlling the modulation of said power amplifier in accordance with a reference signal derived in part, at least, from the amplitude of said modulating signal.

5. The control circuit means as defined by claim 4 wherein said means for controlling the modulation comprises an automatic level control circuit and, additionally including means for sensing the RF level output of said power amplifier and providing a signal corresponding thereto, and wherein said automatic level control circuit is responsive to both said reference signal and the signal corresponding to the RF level output.

6. The control circuit means as defined by claim 5 and additionally including circuit means for applying a DC bias voltage to the amplitude of said modulating signal and providing a composite reference signal thereby.

7. The control circuit means as defined by claim 4 wherein said sensor means comprises a series resistor coupled between said adaptive power supply and said at least one amplifier stage and circuit means coupled to said series resistor for sensing the voltage drop thereacross.

8. The control circuit means as defined by claim 7 wherein said circuit means for sensing the voltage across said series resistor comprises operational amplifier means providing a weighted output and having first and second inputs and including first resistive coupling means coupling one side of said series resistor to said first input and second resistive coupling means coupling the other side of said series resistor to said second input of said operational amplifier.

9. The control circuit means as defined by claim 8 wherein said resistive coupling means comprises first and second voltage dividers each having an intermediate circuit node respectively coupled to said first and second inputs.

10. The control circuit means as defined by claim 4 wherein said means for comparing includes an operational amplifier having first and second inputs and wherein said first input is coupled to the amplitude of said weighted sum signal and said second input is coupled to the amplitude of said modulating signal.

11. The control circuit means as defined by claim 10 and additionally including offset circuit means for providing a DC offset of said amplitude of said modulating signal applied to said second input of said operational amplifier.

12. The control circuit means as defined by claim 11 and additionally including gain setting amplifier means coupled between said offset circuit means and said second input of said operational amplifier.

13. The control circuit means as defined by claim 12 wherein said offset circuit means comprises a resistive voltage divider network having an intermediate circuit node and said amplifier means comprises an operational amplifier having an input coupled to said intermediate circuit node.

* * * * *